United States Patent [19]

Nizaka

[11] Patent Number: 5,682,389
[45] Date of Patent: Oct. 28, 1997

[54] NON-VOLATILE MEMORY DEVICE HAVING BUILT-IN TEST PATTERN GENERATOR USED IN A DIAGNOSTIC OPERATION ON CONTROL SIGNAL LINES FOR DATA PROPAGATION PATH

[75] Inventor: Minoru Nizaka, Tokyo, Japan

[73] Assignee: NEC Corporation, Tokyo, Japan

[21] Appl. No.: 35,794

[22] Filed: Mar. 23, 1993

[30] Foreign Application Priority Data

Mar. 26, 1992 [JP] Japan .................... 4-067852

[51] Int. Cl.$^6$ .................. G11C 29/00; G01R 31/28
[52] U.S. Cl. ............................. 371/21.1; 371/27
[58] Field of Search ................. 371/21.1, 27, 21.3, 371/21.2, 22.2, 22.5

[56] References Cited

U.S. PATENT DOCUMENTS

| | | | |
|---|---|---|---|
| 4,672,583 | 6/1987 | Nakaizumi | 365/222 |
| 4,701,919 | 10/1987 | Naitoh et al. | 371/21 |
| 4,872,168 | 10/1989 | Aadsen et al. | 371/21.3 |
| 4,982,380 | 1/1991 | Koike | 365/201 |
| 4,999,813 | 3/1991 | Ohtsuka et al. | 365/201 |
| 5,159,599 | 10/1992 | Steele et al. | 371/22.2 |
| 5,241,501 | 8/1993 | Tanaka | 365/201 |
| 5,267,212 | 11/1993 | Takashima | 365/201 |

*Primary Examiner*—Hoa T. Nguyen
*Attorney, Agent, or Firm*—Sughrue,Mion,Zinn,Macpeak & Seas, PLLC

[57] ABSTRACT

A non-volatile memory device has a built-in test pattern generator used during diagnostics of control signal lines. An internal test pattern generator supplies a test pattern to digit lines so that short circuit between decoded signal lines to a column selector changes the internal test pattern, thereby effectively screening out a defective product. Digit lines of the memory device are sequentially coupled through the column selector with a sense amplifier circuit in a diagnostic operation to see whether or not any defective component is incorporated therein.

3 Claims, 3 Drawing Sheets

NON-VOLATILE MEMORY DEVICE HAVING BUILT-IN TEST PATTERN GENERATOR USED IN A DIAGNOSTIC OPERATION ON CONTROL SIGNAL LINES FOR DATA PROPAGATION PATH

FIELD OF THE INVENTION

This invention relates to a non-volatile semiconductor memory device such as, for example, an electrical programmable read only memory device and, more particularly, to a non-volatile semiconductor memory device having a built-in test pattern used in a diagnostic operation on control signal lines for a data propagation path.

DESCRIPTION OF THE RELATED ART

A typical example of the electrically programmable read only memory device is illustrated in FIG. 1 of the drawings, and largely comprises a memory cell array 1, an addressing means, a data transferring means and a character information storage 2. The memory cell array 1 is implemented by a plurality of electrical programmable read only memory cells M11, M12, M13, M14, M1n, Mm1 and Mmn such as floating gate type field effect transistors, and the electrically programmable read only memory cells M11 to Mmn are arranged in rows and columns. The electrically programmable read only memory cells M11 to Mmn simultaneously enter erased state in the presence of ultraviolet radiation, and selectively enter programmed state through injection of hot electrons into the floating gate electrodes. While the electrically programmable read only memory cells M11 to Mmn remain in the erased state, the threshold levels thereof are low. However, if an electrically programmable read only memory cell enters the programmed state, the threshold level becomes high.

The addressing means is operative to select a electrically programmable read only memory cell from the memory cell array 1, and comprises a plurality of word lines WL1 to WLm respectively associated with the rows of the electrically programmable read only memory cells M11 to Mmn, a row address decoder unit 3a, column address decoder units 3b and 3c and a column selector unit 3d. The word lines WL1 to WLm are coupled with the control gate electrodes of the electrical programmable read only memory cells M11 to Mmn in the associated rows, and the row address decoder unit 3a is responsive to row address bits for selectively driving the word lines WL1 to WLm. The column selector unit 3d has a primary stage implemented by n-channel enhancement type transfer transistors TG1, TG2, TG3, TG4, TGm and TGn associated with the columns of the memory cell array 1, respectively, and a secondary stage implemented by n-channel enhancement type transfer transistors TG11, TG12 and TGi each associated with every adjacent two columns of the memory cell array 1. The column address decoder units 3b and 3c are respectively associated with the primary and secondary stages of the column selector unit 3d, and are responsive to column address bits for selecting a column from the memory cell array 1.

The data transferring means comprises a plurality of digit lines DL1 to DLn, a sense amplifier unit 4a and a reference circuit 4b. The digit lines DL1 to DLn are respectively associated with the columns of the memory cell array 1, and are coupled with the drain nodes of the electrically programmable read only memory cells M11 to Mmn in the associated columns, respectively. The source nodes of all the electrically programmable read only memory cells M11 to Mmn are grounded. As described hereinbefore, the electrically programmable read only memory cells M11 to Mmn selectively enters the erased state and the programmed state corresponding to the low threshold level and the high threshold level, and the word lines WL1 to WLm are selectively driven to an intermediate voltage level between the high and low threshold levels. While staying in the erased state, the electrically programmable read only memory cell turns on in the presence of the middle voltage level. However, if an electrically programmable read only memory cell enters the programmed state, the electrically programmable read only memory cell is turned off even if the associated word line is driven to the middle voltage level. Therefore, the erased state and the programmed state are corresponding to the on-state and the off-state of the electrically programmable read only memory cells.

The sense amplifier unit 4a is, by way of example, implemented by a differential amplifier circuit, and one of the input nodes is coupled with the output node of the column selector unit 3d, and the other input node is coupled with the reference circuit 4b. The reference circuit 4b is implemented by a series combination of electrically programmable read only memory cells and n-channel enhancement type transfer transistors which correspond to the electrical programmable read only memory cells coupled with one of the digit lines and the n-channel enhancement type transfer transistors of the column selector unit 3d. The cells and the transistors of the reference circuit 4b are arranged in such a manner as to produce a middle resistance between the total resistance of the character information storage 2, the memory cell array 1 and the column selector unit 3d with a current path to the ground voltage line and the total resistance of the character information storage 2, the memory cell array 1 and the column selector unit 3d without any current path to the ground voltage line. The sense amplifier circuit 4a supplies current through the column selector unit 3d to a selected digit line, and the voltage level at the associated input node of the sense amplifier unit 4a is variable depending upon the state of the accessed electrically programmable read only memory cell. However, the reference circuit 4b keeps the other input node of the sense amplifier circuit 4a constant, and the voltage level at the other input node is regulated to an intermediate voltage between high voltage level indicative of the programmed state and low voltage level indicative of the erased state. Therefore, the sense amplifier unit 4a discriminates the state of the accessed electrically programmable read only memory cell through comparison of the voltage levels between the input nodes thereof, and produces an output data signal indicative of the state of the accessed electrically programmable read only memory cell. The erased state and the programmed state are corresponding to logic "1" and logic "0", respectively.

The character information storage 2 comprises a row of electrically programmable read only memory cells DM1 to DMn, a dummy word line DWL and a dummy decoder unit 2a. The electrically programmable read only memory cells DM1 to DMn are prevented from the ultra-violet light, and are not rewriteable after assembled in a package. The electrically programmable read only memory cells DM1 to DMn stores pieces of character information indicative of, for example, a memory capacity and a discriminative code assigned thereto. The dummy word line DWL is coupled with the control gates of the electrically programmable read only memory cells DM1 to DMn, and is driven by the dummy decoder unit 2a. The dummy decoder unit 2a is responsive to a dummy address bit, and drives the dummy word line DWL in so far as the row address decoder unit 3a keeps all of the word lines WL1 to WLm inactive.

The prior art electrically programmable read only memory device thus arranged is fabricated through a process sequence, and is subjected to a diagnosis upon completion. Namely, test patterns are sequentially written into the electrically programmable read only memory cells M11 to Mmn, and are read out therefrom. The read-out test patterns are compared with the write-in test patterns to see whether or not any discrepancy takes place. If the read-out test patterns are in consistence with the write-in test patterns, the electrically programmable read only memory cells are excellent. However, if the discrepancy takes place, the memory cell array 1 contains a defective memory cell, and the row containing the defective memory cell is replaced with a row of redundant memory cells (not shown).

Thus, the redundant memory cells rescues the electrically programmable read only memory device from rejection, and the test patterns become complex, because the redundant memory cells are taken into account. The test patterns are formed in accordance with selecting pattern of the word lines WL1 to WLm and the digit lines DL1 to DLn carried out by the row address decoder unit 3a and the column address decoder units 3b and 3c, and a test pattern is usually repeatedly supplied to the memory cell array 1.

However, a problem is encountered in the prior art electrically programmable read only memory device in that the test pattern is not effective against short circuit between the decoded signal lines of the column address decoder units 3b and 3c and between the word lines WL1 to WLm. In detail, if a test pattern is implemented by a bit string "1100 . . .", the test pattern of "1100 . . . " is written into the electrically programmable read only memory cells M11, M12, M13, M14, . . . and M1n in the programming phase, and, accordingly, the electrical programmable read only memory cells M13 and M14 enter the programmed state, leaving the electrically programmable read only memory cells M11 and M11 in the erased state. The test pattern "1100 . . . " is read out to the digit lines DL1, DL2, DL3, DL4, . . . and DLn in the read-out phase. If the decoded signal lines of the column address decoder unit 3b are undesirably conducted, multiple selection takes place, and the current is supplied from the sense amplifier unit 4a through the secondary stage of the column selector unit 3d to both n-channel enhancement type transfer transistors TG1 and TG2 or TG3 and TG4. However, both electrically programmable read only memory cells M11 and M12 are in the erased state, and both electrical programmable read only memory cells M13 and M14 are in the programmed state. For this reason, the bit string of "1100 . . . " is sequentially read out from the electrical programmable read only memory cells M11, M12, M13, M14, . . . , and an external diagnostic system (not shown) decides that any trouble does not take place in the electrically programmable read only memory device. Since the integration density is progressively increased, short circuit is much liable to take place, and the prior art test pattern is not effective against short circuit between the decoded signal lines and between the word lines WL1 to WLm.

If the test sequence using different test patterns is repeated, the short circuit may be found. However, the repetition prolongs the diagnosis, and increases the inspection cost.

SUMMARY OF THE INVENTION

It is therefore an important object of the present invention to provide a non-volatile semiconductor memory device which allows an external diagnostic system to find the short circuit without change of a test pattern.

To accomplish the object, the present invention proposes to provide an internal test pattern generator for decoded signal lines or word lines.

In accordance with one aspect of the present invention, there is provided a non-volatile semiconductor memory device selectively entering a standard mode and a diagnostic mode of operation, comprising: a) a memory cell array having a plurality of non-volatile memory cells arranged in rows and columns; b) a plurality of word lines respectively associated with the rows of the memory cell array, and coupled through word lines with a row address decoder unit for allowing data bits to be read out from one of the rows of the memory cell array in the standard mode; c) a plurality of digit lines associated with the columns of the memory cell array; d) an internal test pattern generator coupled with the plurality of digit lines, and activated in the diagnostic mode for supplying test bits to the plurality of digit lines; and e) a column selector unit coupled through decoded signal lines with a column address decoder means for transferring one of the data bits in the standard mode and one of the test bits in the diagnostic mode to a sense amplifier unit, the sense amplifier unit being operative to produce an output signal indicative of the one of the data bits or the one of the test bits.

In accordance with another aspect of the present invention, there is provided a non-volatile semiconductor memory device selectively entering a standard mode and a diagnostic mode of operation, comprising: a) a memory cell array having a plurality of non-volatile memory cells arranged in rows and columns; b) an internal test pattern generator activated in the diagnostic mode, and operative to sequentially supply test bits to a sense amplifier means; c) a plurality of word lines coupled between a row address decoder unit and the rows of the memory cell array, and selectively driven to active level for allowing data bits to be read out from one of the rows of the memory cell array in the standard mode, the plurality of word lines being further coupled with the internal test pattern generator for causing the internal test pattern generator to produce one of the test bits depending upon a word line selected from the plurality of word lines in the diagnostic mode; d) a plurality of digit lines associated with the columns of the memory cell array; and e) a column selector unit coupled through decoded signal lines with a column address decoder means for transferring one of the data bits to the sense amplifier means in the standard mode, the sense amplifier means being operative to produce an output signal indicative of the one of the data bits or the one of the test bits.

BRIEF DESCRIPTION OF THE DRAWINGS

The feature and advantages of the non-volatile semiconductor memory device according to the present invention will be more clearly understood from the following description taken in conjunction with the accompanying drawings in which.

DESCRIPTION OF THE PREFERRED EMBODIMENTS

First Embodiment

Figure 1:
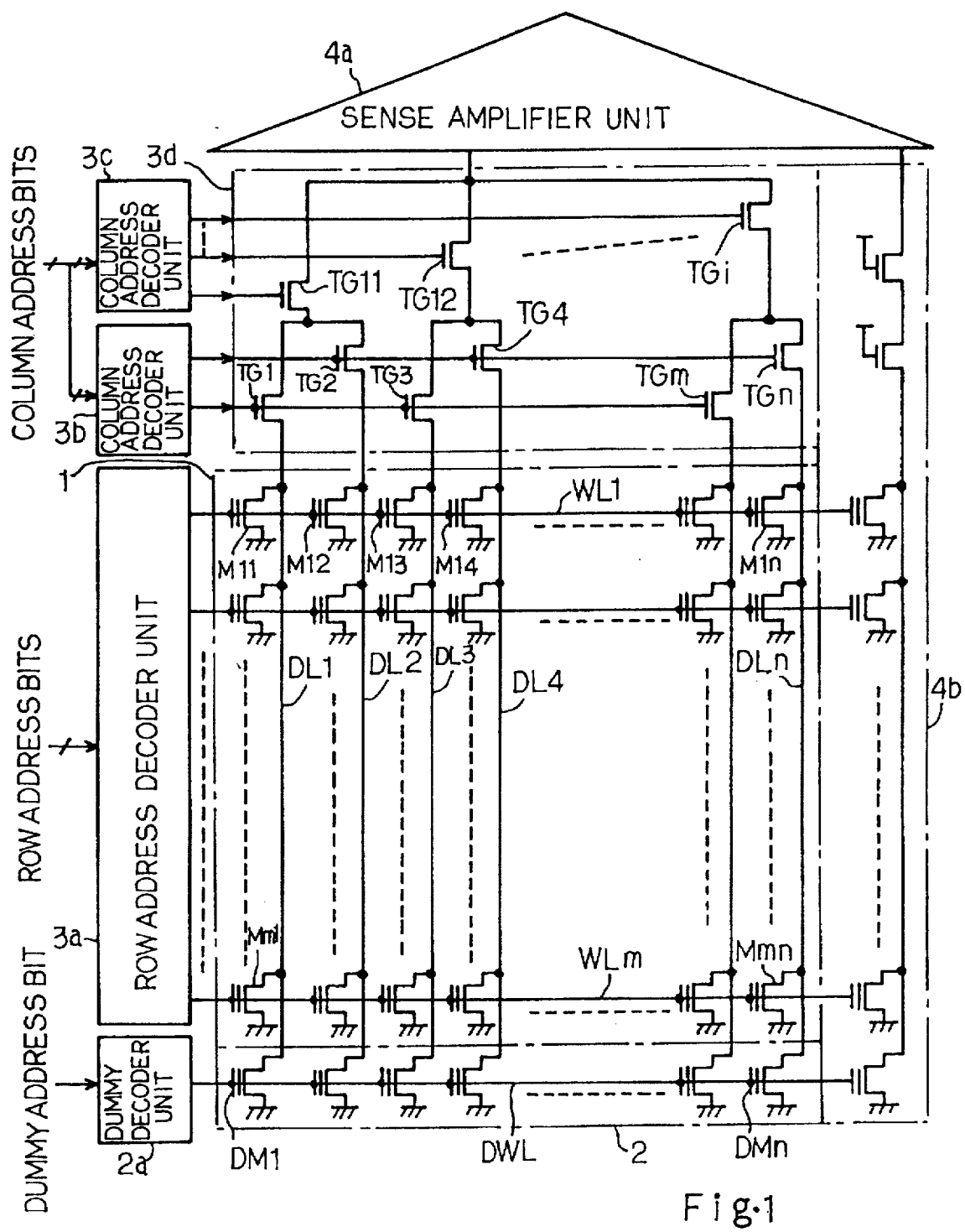
FIG. 1 is a circuit diagram showing the arrangement of the prior art electrical programmable read only memory device.
Figure 2:
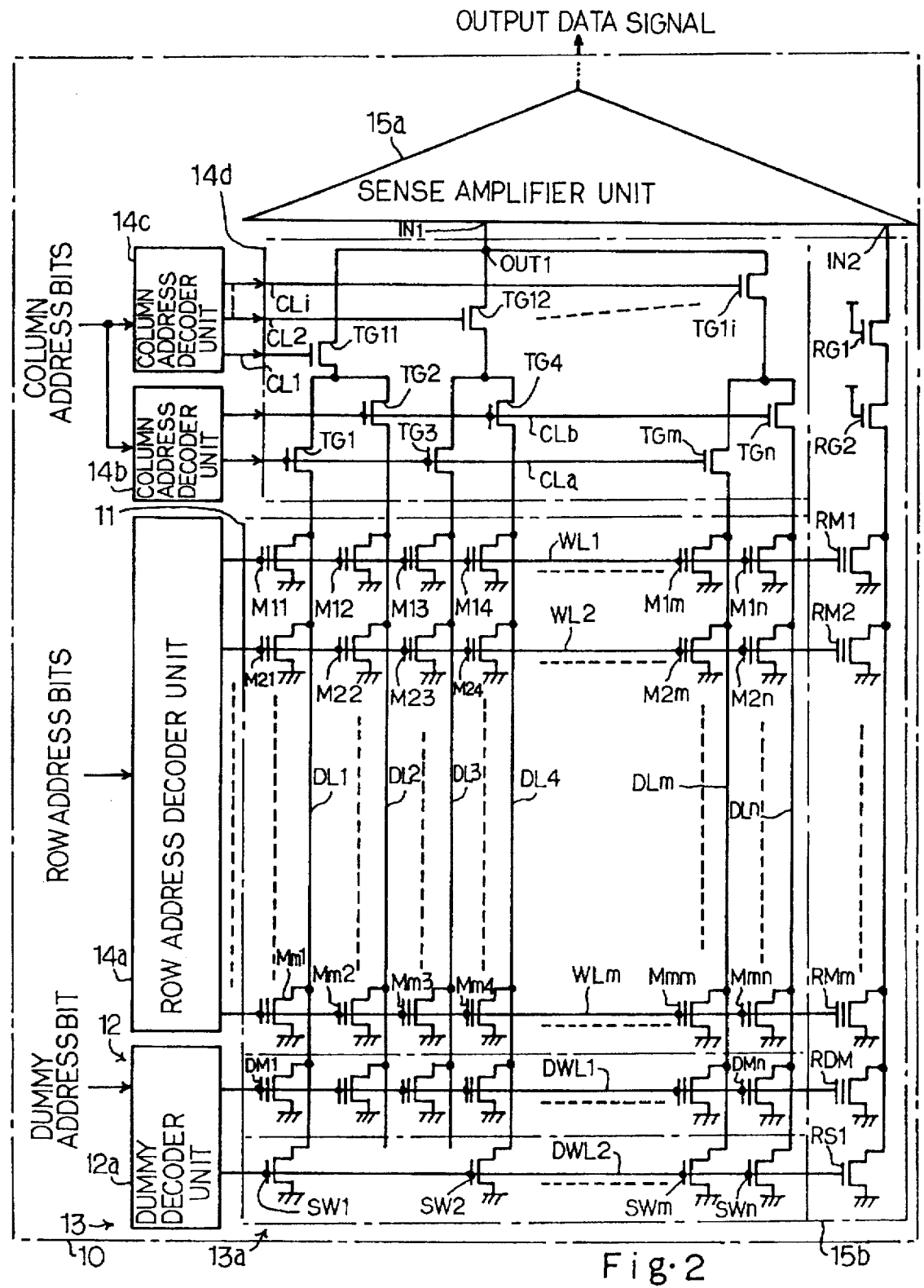
FIG. 2 is a circuit diagram showing the arrangement of an electrically programmable read only memory device according to the present invention.

Referring to FIG. 2 of the drawings, an electrically programmable read only memory device embodying the present invention is fabricated on a single semiconductor chip 10, and largely comprises a memory cell array 11, an addressing means, a data transferring means, a character information storage 12 and an internal test pattern generator 13. The electrically programmable read only memory device selectively enters a read-out mode, a write-in mode, an erasing mode and a diagnostic mode of operation. In this instance, the read-out mode, the write-in mode and the erasing mode constitute a standard mode of operation.

The memory cell array 11 is implemented by a plurality of electrical programmable read only memory cells M11, M12, M13, M14, M1mm M1n, M21, M22, M23, M24, M2m, M2n, Mm1, Mm2, Mm3, Mm4, Mmm and Mmn, and the electrical programmable read only memory cells M11 to Mmn are floating gate type field effect transistors. The electrically programmable read only memory cells M11 to Mmn are arranged in rows and columns, and are selectively addressable with row and column address bits.

The electrically programmable read only memory cells M11 to Mmn are changeable between erased state and programmed state. If the electrically programmable read only memory cells M11 to Mmn are exposed to ultra-violet light, electrons are evacuated from the floating gate electrodes, and the electrically programmable read only memory cells M11 to Mmn simultaneously enter the erased state. The electrically programmable read only memory cells M11 to Mmn in the erased state have relatively low threshold level corresponding to Logic "1" bit, and turn on in the presence of read-out voltage level at the control gates thereof. The electrically programmable read only memory cells M11 to Mmn selectively enter the programmed state through injection of hot electrons into the floating gates. Though not shown in FIG. 2, a write-in circuit selectively applies extremely high write-in voltage to the drain nodes of the electrically programmable read only memory cells for producing the hot electrons at the p-n junctions between the drain nodes and the semiconductor chip, and the hot electrons are accumulated in the floating gates. If the electrons are accumulated in the floating gates, the electrically programmable read only memory cells have high threshold level corresponding to logic "0" bit, and are turned off in the presence of the read-out voltage at the control gates.

The addressing means is operative to select a electrically programmable read only memory cell from the memory cell array 11, and comprises a plurality of word lines WL1 to WLm respectively associated with the rows of the electrically programmable read only memory cells M11 to Mmn, a row address decoder unit 14a, column address decoder units 14b and 14c and a column selector unit 14d.

The word lines WL1 to WLm are coupled with the control gates of the electrical programmable read only memory cells M11 to Mmn in the associated rows, and the row address decoder unit 14a is responsive to the row address bits for selectively driving the word lines WL1 to WLm.

The column selector unit 14d has a primary stage and a secondary stage. The primary stage is implemented by n-channel enhancement type transfer transistors TG1, TG2, TG3, TG4, TGm and TGn respectively associated with the columns of the memory cell array 11, respectively, and decoded signal lines CLa and CLb are coupled with the column address decoder unit 14b. The secondary stage is implemented by n-channel enhancement type transfer transistors TG11, TG12 and TG1i each associated with every adjacent two columns of the memory cell array 11, and decoded signal lines CL1, CL2, . . . and CLi selectively couple the column address decoder unit 14c with the gate electrodes of the n-channel enhancement type transfer transistors TG11 to TG1i. The column address decoder units 14b and 14c are responsive to the column address bits for selecting a column from the memory cell array 11.

The data transferring means comprises a plurality of digit lines DL1, DL2, DL3, DL4, DLm and DLn, a sense amplifier unit 15a and a reference circuit 15b. The digit lines DL1 to DLn are respectively associated with the columns of the memory cell array 11, and are coupled with the drain nodes of the electrically programmable read only memory cells M11 to Mmn in the associated columns. The source nodes of all the electrically programmable read only memory cells M11 to Mmn are grounded.

As described hereinbefore, the electrically programmable read only memory cells M11 to Mmn selectively enters the erased state and the programmed state corresponding to the low threshold level and the high threshold level, and the word lines WL1 to WLm are selectively driven to the read-out voltage level between the high and low threshold levels. While staying in the erased state, the electrically programmable read only memory cell turns on in the presence of the read-out voltage level, and a current path is established from the associated digit line to the ground voltage line. However, if an electrically programmable read only memory cell enters the programmed state, the electrically programmable read only memory cell is turned off in the presence of the read-out voltage level, and any current path is established from the associated digit line to the ground voltage line. Therefore, voltage level on the selected digit line is variable depending upon the state of a selected electrically programmable read only memory cell.

The sense amplifier unit 15a is, by way of example, implemented by a differential amplifier circuit, and one of the input nodes thereof IN1 is coupled with the output node OUT1 of the column selector unit 3d, and the other input node IN2 is coupled with the reference circuit 15b. The reference circuit 15b is implemented by a series combination of electrically programmable read only memory cells RM1, RM2 to RMm and RDM, n-channel enhancement type transfer transistors RG1 and RG2 and an n-channel enhancement type switching transistors RS1, and the electrically programmable read only memory cells RM1 to RMm and RDM, the n-channel enhancement type transfer transistors RG1 and RG2 and the n-channel enhancement type switching transistor RS1 are arranged in such a manner as to produce a middle voltage level between high voltage level indicative of the electrically programmable read only memory cell in the programmed state and low voltage level indicative of the electrical programmable read only memory cell in the erased state. The sense amplifier circuit 15a supplies current through the column selector unit 14d to a selected digit line, and the voltage level at the input node IN1 is variable depending upon the state of the accessed electrically programmable read only memory cell. However, the reference circuit 15b keeps the other input node IN2 constant. Therefore, the sense amplifier unit 15a discriminates the state of the accessed electrically programmable read only memory cell through comparison of the voltage levels between the input nodes IN1 and IN2, and produces an output data signal indicative of the state of the accessed electrically programmable read only memory cell.

The character information storage 12 comprises a row of electrically programmable read only memory cells DM1 to DMn, a first dummy word line DWL1 and a dummy decoder unit 12a. The electrically programmable read only memory cells DM1 to DMn are prevented from the ultra-violet light, and are not rewriteable after assembled in a package. The electrically programmable read only memory cells DM1 to DMn stores pieces of character information indicative of, for example, a memory capacity and a discriminative code assigned thereto. The dummy word line DWL1 is coupled between the dummy decoder unit 12a and the control gates of the electrically programmable read only memory cells DM1 to DMn, and is driven by the dummy decoder unit 12a. The dummy decoder unit 2a is responsive to a dummy address bit, and drives the dummy word line DWL in so far as the row address decoder unit 3a keeps all of the word lines WL1 to WLm inactive.

The internal test pattern generator 13 comprises a mask ROM cell array 13a implemented by n-channel enhancement type switching transistors SW1, SW2, SWm and SWn coupled between digit lines DL1, DL4, DLm and DLn and the ground voltage line, a second dummy word line DWL2 and the dummy decoder unit 12a. In this instance, the dummy decoder unit 12a is shared between the character information storage 12 and the internal test pattern generator 13. The second dummy word line DWL2 is coupled between the dummy decoder unit 12a and the gate electrodes of the n-channel enhancement type switching transistors SW1 to SWn, and is driven to active high voltage level when any one of the word lines WL1 to WLm and the first dummy word line DWL1 remain inactive. The digit lines coupled with the n-channel enhancement type switching transistors SW1 to SWn are selected in such a manner that discrepancy takes place between the excellent decoded signal lines CLa and CLb and defective decoded signal lines CLa and CLb. In this instance, the mask ROM cell array 13a supplies a test pattern of "1001 ... 11" to the digit lines DL1 to DLn.

The test pattern thus internally produced effectively finds undesirable conduction between the decoded signal lines CLa and CLb. In a diagnostic operation on the decoded signal lines CLa and CLb, the row address bits causes the row address decoder unit 14a to keep all of the word lines WL1 to WLm inactive, and any electrically programmable read only memory cells M11 to Mmn are turned off regardless of the state thereof. However, the dummy address bit causes the dummy decoder unit 12a to drive the second dummy word line DWL2 to the active high voltage level, leaving the first dummy word line DWL1 in the inactive low voltage level. Therefore, the n-channel enhancement type switching transistors SW1 to SWn turn on, and only the digit lines DL1, DL4, DLm and DLn are conducted with the ground voltage line. The sense amplifier unit 15a supplies current to the column selector unit 14d, and the column address bits allow the column address decoder units 14b and 14c to sequentially conduct the digit lines DL1 to DLn with the sense amplifier unit 15a.

If the decoded signal lines CLa and CLb are appropriately isolated from each other, the n-channel enhancement type transfer transistors TG1, TG3 and TGm and the n-channel enhancement type transfer transistors TG2, TG4 and TGn alternately turn on and off, and the current is sequentially relayed to the digit lines DL1 to DLn. As a result, the sense amplifier unit 15a the low voltage level, the high voltage level, the high voltage level, the low voltage level, ...., the low voltage level and the low voltage level are sequentially supplied from the digit lines DL1, D12, DL3, D14,...., Dlm and DLn to the sense amplifier unit 15a, and the sense amplifier unit 15a produces a read-out test pattern of "1001 ... 11" through comparison with the middle voltage level at the input node IN2. The read-out test pattern is supplied from the sense amplifier unit 15a to an external diagnostic system (not shown), and the external diagnostic system diagnoses the electrically programmable read only memory device to be excellent.

However, if the decoded signal lines CLa is undesirably conducted with the decoded signal line CLb, all of the n-channel enhancement type transfer transistors TG1 to TGn turn on, and adjacent two digit lines such as Dl1 and DL2 are simultaneously coupled with the sense amplifier unit 15a. Even if the external diagnostic system selects the digit line DL2 or DL3, the current flows from the digit line DL1 or DL4 through the n-channel enhancement type switching transistor SW1 or SW2 to the ground voltage line, and the sense amplifier unit 15a produces a read-out test pattern "1111 ... 11". Therefore, the external diagnostic system can decide that the electrical programmable read only memory device has the defective decoded signal lines CLa and CLb.

As will be appreciated from the foregoing description, the internal test pattern generator 13 causes the read-out test pattern to be different between a defective device and an excellent device, and effectively screens out defective products without sacrifice of the inspection cost.

Second Embodiment

Figure 3:
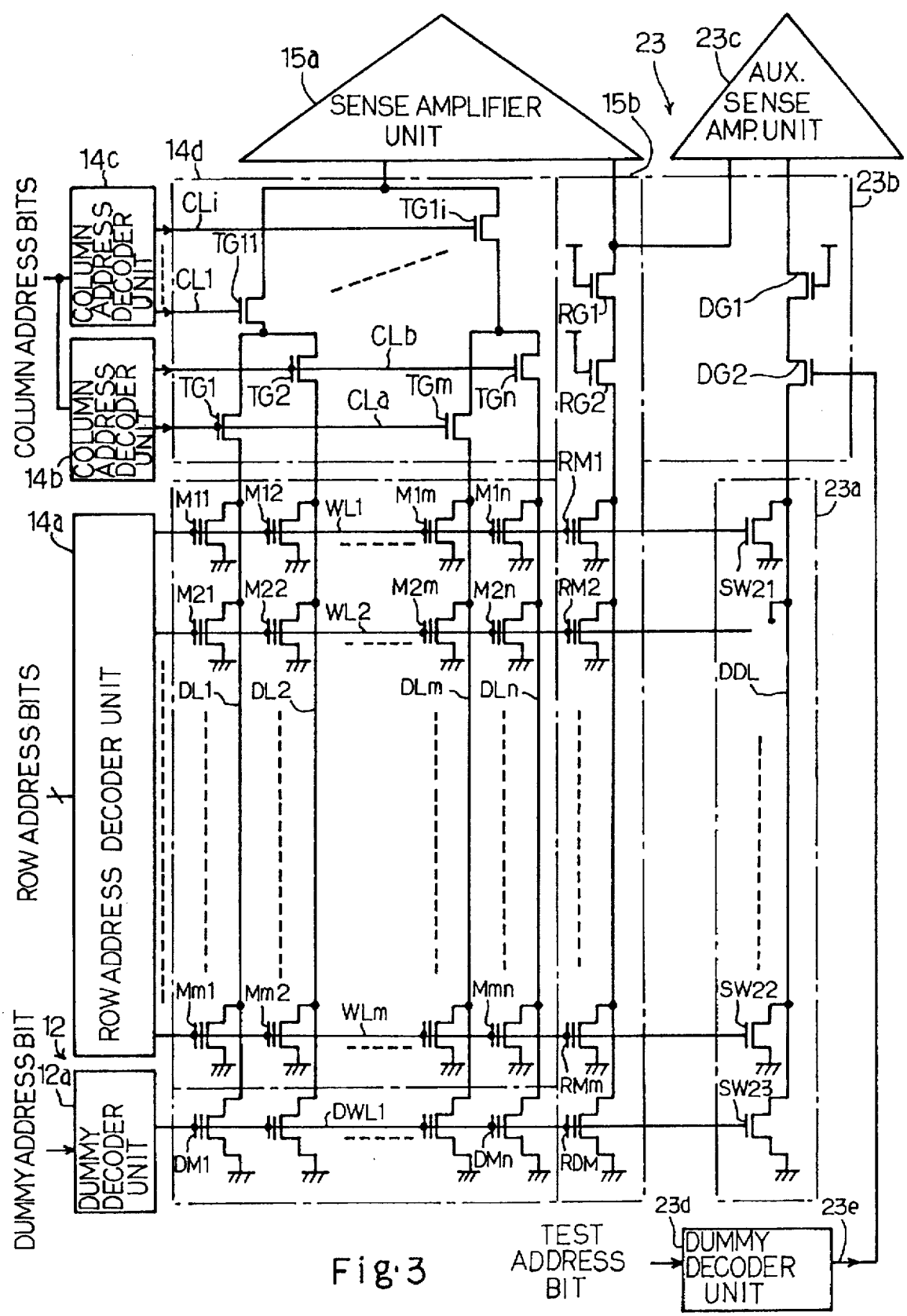
FIG. 3 is a circuit diagram showing the arrangement of another electrically programmable read only memory device according to the present invention.

Turning to FIG. 3 of the drawings, another electrically programmable read only memory device embodying the present invention is equipped with an internal test pattern generator 23, the electrically programmable read only memory device shown in FIG. 3 is similar to the first embodiment except for the internal test pattern generator 23, and, for this reason, other component circuits and units are labeled with the same references designating the corresponding circuits and units of the first embodiment without any detailed description.

The internal test pattern generator 23 comprises a mask ROM cell array 23a, a dummy digit line DDL coupled with the mask ROM cell array 23a, a dummy transfer unit 23b and a dummy decoder unit 23d, and is associated with an auxiliary sense amplifier unit 23c. In this instance, the sense amplifier unit 15a and the auxiliary sense amplifier unit 23c as a whole constitute a sense amplifier means.

The mask ROM cell array 23a is implemented by a parallel combination of n-channel enhancement type switching transistors SW21, SW22 and SW23 coupled between the dummy digit line DDL and the ground voltage line, and the n-channel enhancement type switching transistors SW21 to SW23 are gated by the word lines WL1 and WLm and the dummy word line DWL1, respectively. However, any switching transistor is not provided for the word line WL2. The n-channel enhancement type switching transistors of the mask ROM cell array may be alternately associated with the word lines WL1 to WLm.

The dummy transfer unit 23b is implemented by a series combination of n-channel enhancement type dummy transfer transistors DG1 and DG2, and provides resistance equivalent to the column selector unit 14d against current. The n-channel enhancement type dummy transfer transistor DG1 is turned on at all times, and the n-channel enhancement type dummy transfer transistor DG2 is switched with a decoded signal line 23e.

The dummy decoder unit 23d can drive the decoded signal line 23e to active high voltage level only when the column address decoder units 14b and 14c keep all of the n-channel enhancement type transfer transistors TG1 to TGn and TG11 to TG1i in the off-state.

The auxiliary sense amplifier unit 23c is implemented by a differential circuit, and has two input nodes coupled with the dummy digit line DDL and the reference circuit 15b, respectively. The auxiliary sense amplifier circuit 23c compares the voltage level on the dummy digit line DD1 with the middle voltage level supplied from the reference circuit 15b, and determines that one of the n-channel enhancement type switching transistors SW21 to SW23 is associated with a selected word line or the dummy word line DWL1.

In a diagnostic operation on the word lines WL1 to WLm and the dummy word line DWL1, the dummy decoder unit 23d allows the n-channel enhancement type dummy transfer transistor DG2 to turn on, and the row address decoder unit 14a and the dummy decoder unit 12a sequentially drive the word lines WL1 to WLm and the dummy word line DWL1. Then, an internal test pattern is produced on the dummy digit line DDL, and is transferred to the auxiliary sense amplifier circuit 23c. If the word lines WL1 to WLm and the dummy word line DWL1 is appropriately isolated from one another, the read-out test pattern consists of read-out bits corresponding to the pattern of the mask ROM cell array 23a. However, if short circuit takes place, multiple selection takes place in the word lines WL1 to WLm and the dummy word line DWL1, and the read-out test pattern is different from the pattern of the mask ROM cell array 23a. As a result, an external diagnostic system (not shown) decides that the electrically programmable read only memory device is defective.

The first and second embodiments are respectively equipped with the internal test pattern generator 13 for the decoded signal lines CLa and CLb and with the internal test pattern generator 23 for the word lines WL1 to WLm and the dummy word line DWL1. However, both internal test pattern generators 13 and 23 may be incorporated in yet another electrically programmable read only memory device.

Although particular embodiments of the present invention have been shown and described, it will be obvious to those skilled in the art that various changes and modifications may be made without departing from the spirit and scope of the present invention. For example, the present invention is applicable to an electrically erasable and programmable read only memory device as well as a read only memory device implemented by mask ROM cells. Moreover, the non-volatile memory device according to the present invention may form a part of a large scale integration.

What is claimed is:

1. A non-volatile semiconductor memory device selectively entering a standard mode and a diagnostic mode of operation, comprising:
   a) a memory cell array having a plurality of non-volatile memory cells arranged in rows and columns and implemented by electrically programmable read only memory cells coupled with a constant voltage line;
   b) a plurality of word lines respectively associated with the rows of said memory cell array, and each coupled with the associated row of non-volatile memory cells;
   c) a row address decoder unit selectively energizing said plurality of word lines for allowing data bits to be read out from one of the rows of said memory cell array in said standard mode;
   d) a plurality of digit lines associated with the columns of said memory cell array, and each coupled to the associated column of non-volatile memory cells;
   e) an internal test pattern generator coupled with said plurality of digit lines, and activated in said diagnostic mode for supplying test bits to said plurality of digit lines, said internal test pattern generator having
      a mask ROM cell array having a plurality of enhancement type switching transistors coupled between digit lines selected from said plurality of digit lines and a constant voltage line,
      a dummy word line coupled with gate electrodes of said plurality of enhancement type switching transistors, and
      a dummy decoder unit operative to drive said dummy word line to active level in said diagnostic mode;
   f) a sense amplifier unit operative to produce an output signal indicative of one of said data bits in said standard mode or one of said test bits in said diagnostic mode;
   g) a column address decoder means; and
   h) a column selector unit coupled through decoded signal lines with said column address decoder means and coupled to said plurality of digit lines, said column address decoder means selectively energizing said decoded signal lines, said column selector unit transferring said one of said data bits in said standard mode and said one of said test bits in said diagnostic mode to said sense amplifier unit in accordance with a selected decoded signal line.

2. A non-volatile semiconductor memory device as set forth in claim 1, in which said column selector unit comprises a primary stage having a plurality pairs of transfer transistors each selecting one of adjacent two digit lines, and a secondary stage having a plurality of transfer transistors for selecting one of said plurality pairs of transfer transistors, said mask ROM cell array having at least one enhancement type switching transistors coupled with said adjacent two digit lines.

3. A non-volatile semiconductor memory device selectively entering a standard mode and a diagnostic mode of operation, comprising:
   a) a memory cell array having a plurality of non-volatile memory cells arranged in rows and columns and implemented by electrically programmable read only memory cells coupled with a constant voltage line;
   b) a sense amplifier means operative to rapidly discriminate logic levels of test bits;
   c) an internal test pattern generator activated in said diagnostic mode, and operative to sequentially supply said test bits to said sense amplifier means;
   d) a plurality of word lines coupled with the rows of said memory cell array and said internal test pattern generator;
   e) a row address decoder unit coupled with said plurality of word lines, and operative to selectively energize said plurality of word lines to active level for allowing data bits to be read out from one of the rows of said memory cell array in said standard mode, wherein, in said diagnostic mode, selection of one of said plurality of word lines causes said internal test pattern generator to produce one of said test bits;
   f) a plurality of digit lines associated with the columns of said memory cell array;
   g) a column address decoder means; and
   h) a column selector unit coupled through said decoded signal lines with said column address decoder means and coupled to said plurality of digit lines, said, column address decoder means selectively energizing said decoded signal lines; said column selector unit transferring one of said data bits to said sense amplifier means in said standard mode, said sense amplifier means being operative to produce an output signal indicative of said one of said data bits or said one of said test bits,
   said internal test pattern generator having
      a mask ROM cell array having a plurality of enhancement type switching transistors coupled in parallel between a dummy digit line and said constant voltage line,
      a dummy transfer unit coupled between said dummy digit line and said sense amplifier means, and produces resistance against current equivalent to resistance produced by said column selector unit, and
      a dummy decoder unit operative to allow said dummy transfer unit to couple said dummy digit line with said sense amplifier means in said diagnostic mode.

* * * * *